United States Patent
Ali et al.

(10) Patent No.: US 6,661,317 B2
(45) Date of Patent: Dec. 9, 2003

(54) MICROWAVE MONOLITHIC INTEGRATED CIRCUIT ASSEMBLY WITH MULTI-ORIENTATION PYROLYTIC GRAPHITE HEAT-DISSIPATING ASSEMBLY

(75) Inventors: Mir Akbar Ali, Lomita, CA (US); Carl W. Peterson, Carson, CA (US)

(73) Assignee: The Boeing Co., Seattle, WA (US)

( * ) Notice: Subject to any disclaimer, the term of this patent is extended or adjusted under 35 U.S.C. 154(b) by 0 days.

(21) Appl. No.: 10/099,221

(22) Filed: Mar. 13, 2002

(65) Prior Publication Data

US 2003/0174031 A1 Sep. 18, 2003

(51) Int. Cl.[7] .............................. H01P 1/00; H01P 3/08; H05K 7/20
(52) U.S. Cl. ...................... 333/247; 333/246; 361/704
(58) Field of Search ................................. 333/247, 246; 330/307; 29/458; 428/320.2; 361/704

(56) References Cited

U.S. PATENT DOCUMENTS

| | | | | |
|---|---|---|---|---|
| 4,890,195 A | * | 12/1989 | Heckaman et al. | ......... 361/718 |
| 4,956,697 A | * | 9/1990 | Kobiki et al. | ............... 257/712 |
| 5,224,030 A | | 6/1993 | Banks et al. | |
| 5,296,310 A | | 3/1994 | Kibler et al. | |
| 5,352,998 A | * | 10/1994 | Tanino | ....................... 333/247 |
| 5,428,882 A | * | 7/1995 | Makowiecki et al. | ...... 29/527.5 |
| 5,520,976 A | | 5/1996 | Giannetti et al. | |
| 5,695,847 A | | 12/1997 | Browne | |
| 5,849,130 A | | 12/1998 | Browne | |
| 5,876,831 A | | 3/1999 | Rawal | |
| 5,958,572 A | | 9/1999 | Schmidt et al. | |
| 6,075,701 A | | 6/2000 | Ali et al. | |
| 6,324,755 B1 | | 12/2001 | Borkowski et al. | |

OTHER PUBLICATIONS

B. Ozmat et al., "A New Composite Core Material for Surface Mount Technology Applications", Proc of Technical Program of Surface Mount International, pp. 569–592 (Aug. 1991).
D. Wein, "Packaging Holds MIMIC Key", *Advanced Packaging*, pp. 36–39 (Summer 1993).
StratEdge Corp., Product Feature–Low Cost Ceramic Packages for mm–Wave GaAs Ics, *Microwave Journal*, pp. 110–111 (Aug. 1994).
G. Gatti, "Design Guidelines for Microwave Monolithic Integrated Circuits", printed from internet web address www.estec.esa.nl/xrmwww/mmic/mmicst.htm on Feb. 21, 2001, 5 pages, document bearing date Sep. 1995.
B. Smith, "Packaging to Beat the Heat", *Semiconductor International*, pp. 73–75 (Nov. 1997).

* cited by examiner

Primary Examiner—Patricia Nguyen

(57) ABSTRACT

A microwave monolithic integrated circuit assembly includes a microwave monolithic integrated circuit having an MMIC circuit plane and having a first region of relatively high heat production and a second region of relatively low heat production. A heat-dissipating assembly is in thermal contact with the microwave monolithic integrated circuit. The heat-dissipating assembly has at least two pieces of pyrolytic graphite embedded within a casing. The pieces of pyrolytic graphite include a first piece of pyrolytic graphite underlying the first region and having a high-thermal-conductivity x-direction of the first piece lying within about 20 degrees of a perpendicular to the MMIC circuit plane, and a second piece of pyrolytic graphite underlying the second region and having a high-thermal-conductivity x-direction of the second piece lying within about 20 degrees of the MMIC circuit plane. The heat-dissipating assembly is preferably fabricated by hot isostatic pressing.

20 Claims, 3 Drawing Sheets

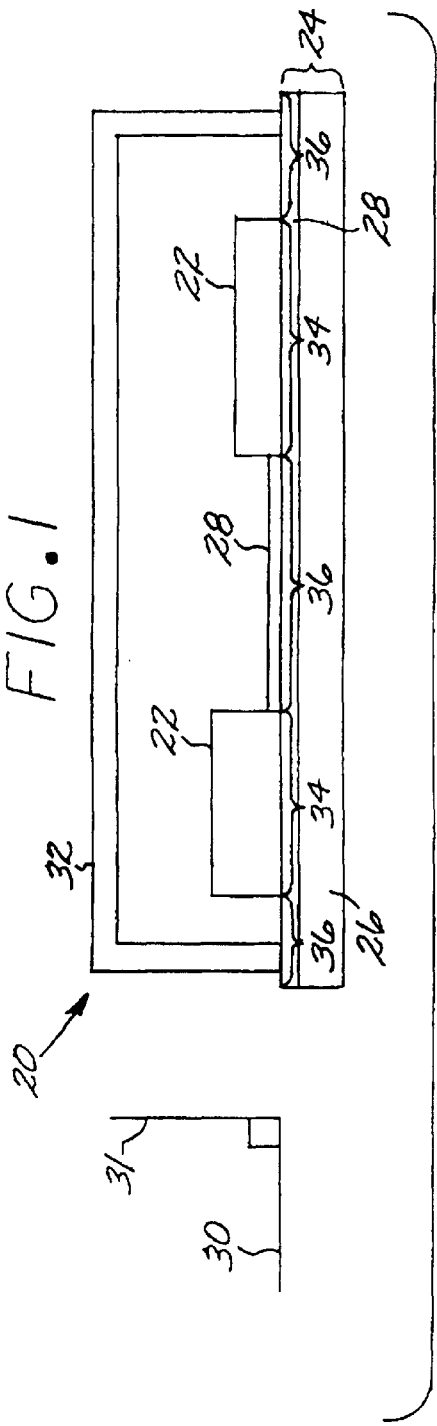
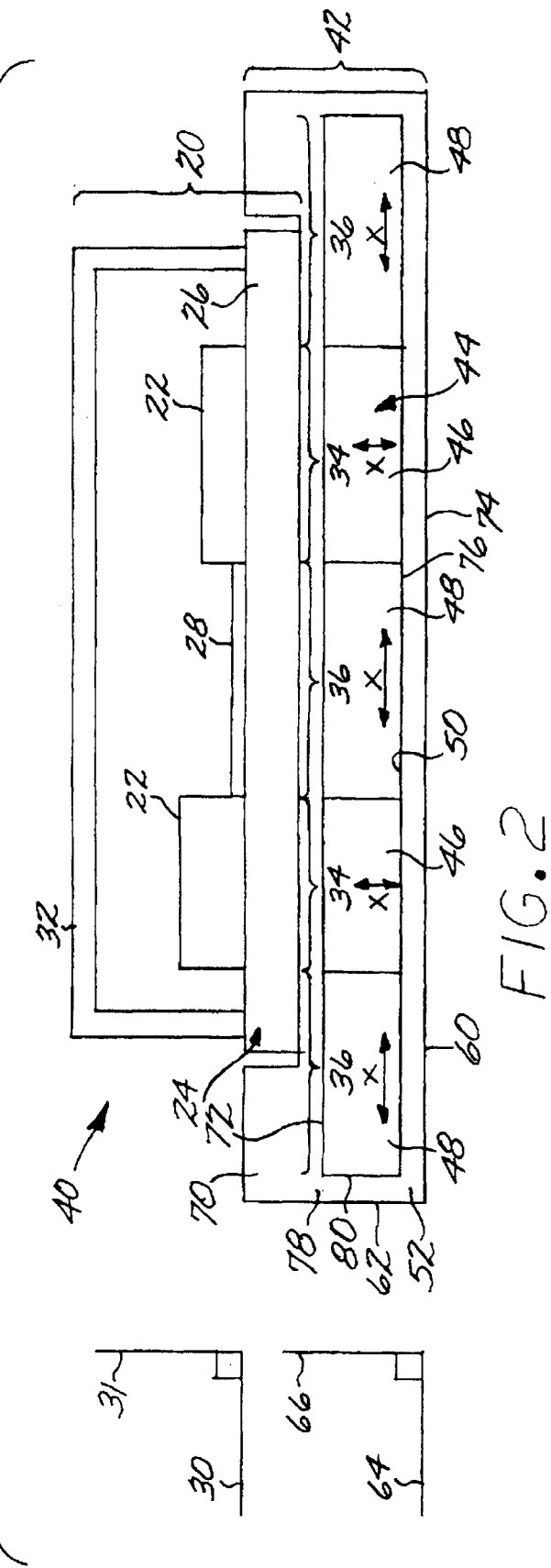

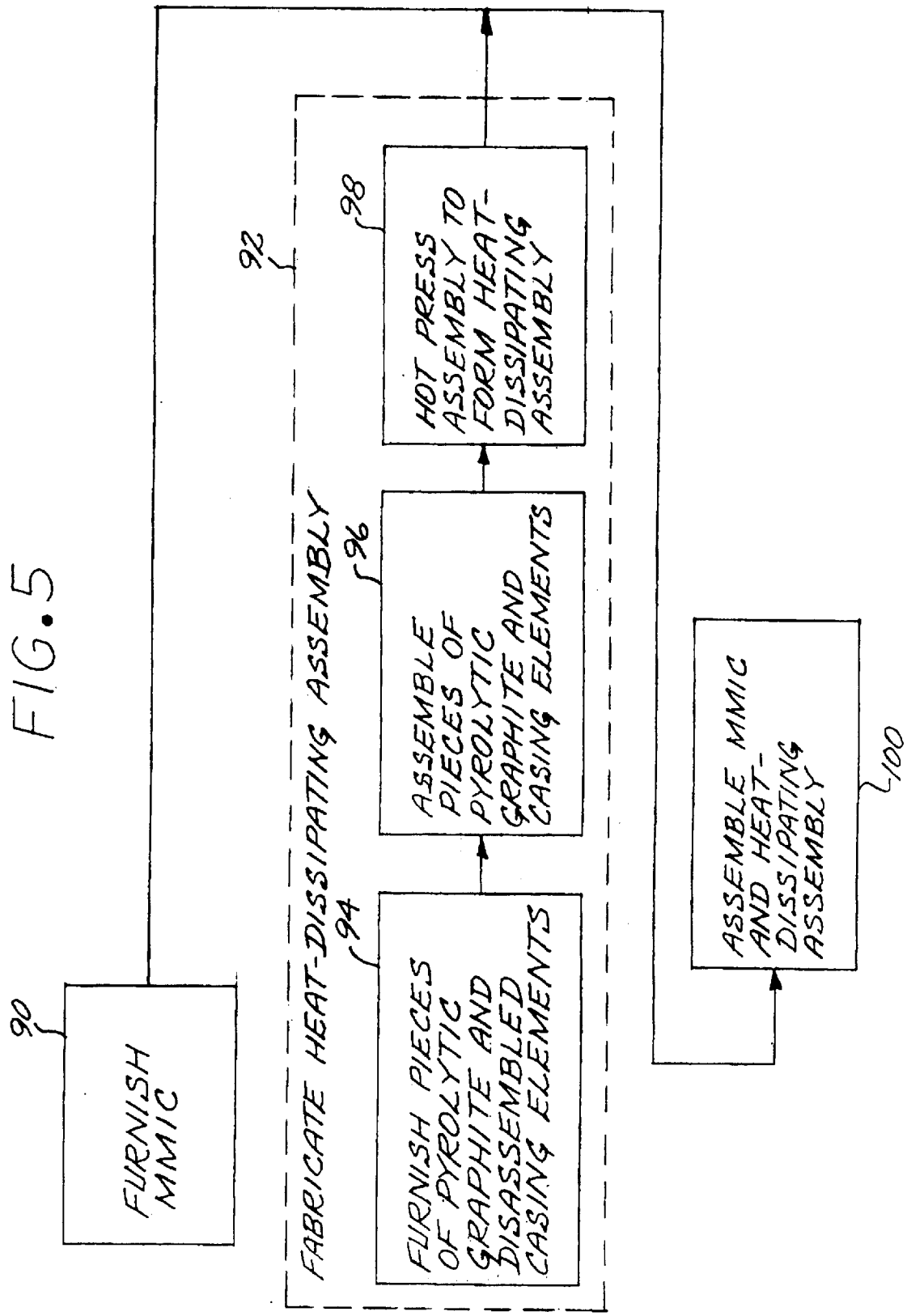

MICROWAVE MONOLITHIC INTEGRATED CIRCUIT ASSEMBLY WITH MULTI-ORIENTATION PYROLYTIC GRAPHITE HEAT-DISSIPATING ASSEMBLY

This invention relates to a microwave monolithic integrated circuit (MMIC) assembly and, more particularly, to such an MMIC assembly wherein the MMIC is supported on a heat-dissipating assembly having multiple pieces of pyrolytic graphite with their high-thermal-conductivity x-directions oriented for optimal heat dissipation from the MMIC.

BACKGROUND OF THE INVENTION

A microwave monolithic integrated circuit (MMIC) is a microwave circuit in which one or more discrete microwave devices are mounted on a substrate. External connections and interconnections between the devices are provided on the substrate. The connections are provided both for low-frequency signals and for the microwave signals being processed. The microwave devices in the MMIC may be of any type.

In a power amplifier or other high-power MMIC, the microwave devices include microwave circuits that process a high-power microwave signal. A large amount of heat is generated as a by-product of the microwave signal processing. The heat must be redistributed and ultimately conducted away, or the resulting increased temperature may exceed the maximum operating temperature limit of the microwave device. If the maximum operating temperature limit is exceeded, the performance of the microwave device is degraded or the device could fail.

The MMIC may be mounted on a heat-management structure that facilitates the initial stages of the removal of the heat from the microwave devices and the substrate to which they are mounted. Historically, the heat-management structure was made of a ceramic such as aluminum oxide, a metal, or a composite material. As the heat outputs have risen and the sizes of the microwave devices have been reduced, the available heat-management materials have not provided the required heat-removal capabilities.

More recently, it has been proposed to utilize encapsulated pyrolytic graphite as the heat-management material. Pyrolytic graphite is an anisotropic material having a high-thermal-conductivity x-direction in which the thermal conductivity is at least 5–10 times greater than many alternative heat-management materials. Pyrolytic graphite also has a low thermal expansion coefficient, reducing the differential thermal strains and stresses between the heat-management structure and the MMIC.

Although pyrolytic graphite offers advantages for use as a heat-management material, it has not been optimized for use with devices such as the MMIC assembly. There is therefore a need for a design in which the pyrolytic graphite is optimized for use in the MMIC assembly, so that its potential may be more fully realized in dissipating heat and maintaining the MMIC within its operating temperature limit. The present invention fulfills this need, and further provides related advantages.

SUMMARY OF THE INVENTION

The present invention provides a microwave monolithic integrated circuit (MMIC) assembly in which encapsulated pyrolytic graphite is used as a heat-dissipation material underlying the MMIC substrate. The spatial orientations of the pyrolytic graphite core are selected for optimal dissipation of heat, recognizing the spatial variation in heat production by the MMIC. The heat-dissipation assembly is readily fabricated as a closed, integral unit that is highly resistant to oxidation, corrosion and other adverse environmental influences.

In accordance with the invention, a microwave monolithic integrated circuit (MMIC) assembly comprises a microwave monolithic integrated circuit lying in an MMIC circuit plane. The MMIC has a first region of relatively high heat production and a second region of relatively low heat production. The first region typically corresponds to the location on the MMIC substrate of a high-heat-output device such as a power amplifier.

A heat-dissipating assembly is in thermal contact with the MMIC. The heat-dissipating assembly has a core comprising at least two pieces of pyrolytic graphite embedded within a casing and bonded to an interior wall of the casing. The pieces of pyrolytic graphite comprise a first piece of pyrolytic graphite underlying (i.e., in vertical alignment with) the first region of relatively high heat production and having a high-thermal-conductivity x-direction of the first piece lying within about 20 degrees of a perpendicular (and preferably substantially perpendicular) to the MMIC circuit plane, and a second piece of pyrolytic graphite underlying the second region of relatively low heat production and having a high-thermal-conductivity x-direction of the second piece lying within about 20 degrees of (and preferably substantially parallel to) the MMIC circuit plane.

The microwave monolithic integrated circuit may include multiple first regions and multiple second regions. In that case, the heat-dissipating assembly includes multiple first pieces of pyrolytic graphite underlying the respective multiple first regions, and multiple second pieces of pyrolytic graphite underlying the respective multiple second regions. The heat-dissipating assembly may further include one or more third pieces of pyrolytic graphite that do not correspond to and underlie the first region of the MMIC, but which have the high-thermal-conductivity x-direction of the pyrolytic graphite within about 20 degrees of the perpendicular (and preferably substantially perpendicular) to the MMIC plane.

In the MMIC assembly, the casing is preferably a metal such as aluminum, copper, and silver, and alloys thereof. The casing preferably comprises a first preform contacting a top of the core, a second preform contacting a bottom of the core, and a lateral wall enclosing a lateral periphery of the core. The casing may be hermetic or non-hermetic. A hermetic casing is preferred, to protect the pyrolytic graphite against environmental attack. The heat-dissipating assembly desirably has no structural layers that are organic materials. Minor amounts of organic contaminants may be present without adversely affecting the functionality of the heat-dissipating assembly, but there are no layers or structural elements made of organic materials intentionally present in the heat-dissipating assembly.

A method for fabricating a microwave monolithic integrated circuit (MMIC) assembly comprises the steps of furnishing a microwave monolithic integrated circuit lying in an MMIC circuit plane and having a first region of relatively high heat production and a second region of relatively low heat production. Separately, a heat-dissipating assembly is fabricated which has a relatively large dimension lying in a heat-dissipating-assembly plane and a relatively small dimension lying perpendicular to the heat-dissipating-assembly plane. The heat-dissipating assembly has a core comprising at least two pieces of pyrolytic graphite embedded within a casing and bonded to an interior wall of the casing. The pieces of pyrolytic graphite comprise a first piece of pyrolytic graphite having a high-thermal-conductivity x-direction of the first piece lying substantially perpendicular to the heat-dissipating-assembly plane, and a second piece of pyrolytic graphite having a high-thermal-conductivity x-direction of the second piece lying substantially parallel to the heat-dissipating-assembly plane. The microwave monolithic integrated circuit is thereafter assembled to the heat-dissipating assembly with the MMIC circuit plane parallel to the heat-dissipating-assembly plane and with the first piece of pyrolytic graphite underlying the first region of relatively high heat production and the second piece of pyrolytic graphite underlying the second region of relatively low heat production. Other features as discussed above may be utilized in relation to this method.

The fabricating of the heat-dissipating assembly preferably includes furnishing the two pieces of pyrolytic graphite and a set of disassembled elements of a casing, assembling the pieces of pyrolytic graphite within the interior of the disassembled elements of the casing positioned so as to form an initial assembly, placing the initial assembly into an evacuated interior of an elevated-temperature pressing apparatus, and heating and simultaneously applying pressure to the initial assembly using the elevated temperature pressing apparatus until a resulting heat-dissipating assembly is substantially fully dense. This heating-and-applying pressure step is desirably accomplished by hot isostatic pressing.

The present approach places the first pieces of the pyrolytic graphite, with the high-thermal-conductivity x-direction near to perpendicular to the MMIC circuit plane, underlying the first regions of the MMIC that have the highest heat production. Heat dissipation from these first regions is thereby facilitated. The second pieces, in which the high-thermal-conductivity x-direction lies near to parallel to the MMIC circuit plane, dissipates heat laterally so that the heat is may be more readily conducted out of the heat-dissipating assembly. The pyrolytic graphite has a low coefficient of thermal expansion in both the x-direction and a z-direction lying perpendicular to the heat-dissipating-assembly plane.

Other features and advantages of the present invention will be apparent from the following more detailed description of the preferred embodiment, taken in conjunction with the accompanying drawings, which illustrate, by way of example, the principles of the invention. The scope of the invention is not, however, limited to this preferred embodiment.

BRIEF DESCRIPTION OF THE DRAWINGS

FIG. 1 is a schematic side-sectional view of a microwave monolithic integrated circuit;

FIG. 2 is a schematic side sectional view of a first embodiment of a microwave monolithic integrated circuit assembly incorporating the microwave monolithic integrated circuit of FIG. 1 and a multi-orientation heat-dissipating assembly;

FIG. 5 is a block flow diagram of a preferred approach for preparing a microwave monolithic integrated circuit assembly.

DETAILED DESCRIPTION OF THE INVENTION

Figure 3:
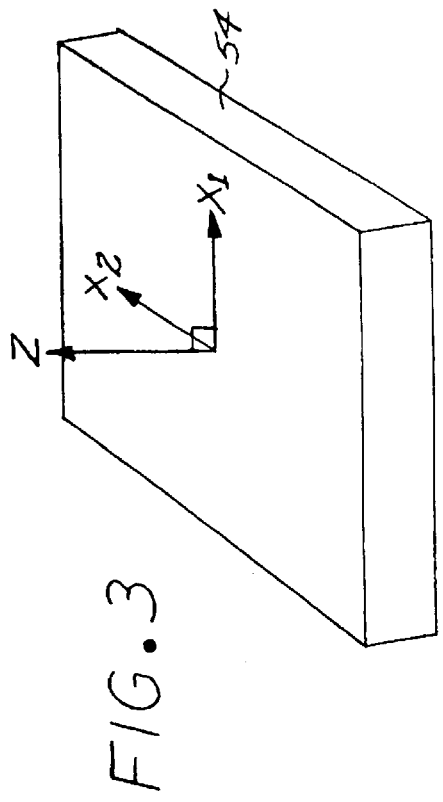
FIG. 3 is a schematic perspective view of a piece of pyrolytic graphite.

FIG. 1 depicts a generally planar microwave monolithic integrated circuit (MMIC) 20. The MMIC 20 includes at least one, and here shown as two, heat-producing microwave devices 22 mounted to a generally planar substrate 24. An example of a heat-producing microwave device 22 is a solid-state power amplifier. The substrate 24 includes a generally planar board 26, which itself may have some heat-management capability, and may include other layers 28 lying between the board 26 and the devices 22 and/or lying on the board 26 and extending between the devices 22. Such layers 28 may include waveguides, striplines, low-frequency interconnect lines, external interconnects, and the like. Optionally, there may be a protective cover 32 supported on the substrate 24 and covering the devices 22 to protect them from mechanical and environmental damage. Although the MMIC 20 is typically not perfectly planar, the MMIC 20 may be described as lying in an MMIC circuit plane 30 that has a perpendicular direction 31 relative thereto. This structure of MMICs 20 is known in the art.

The MMIC 20 has a first region 34 of relatively high heat production and a second region 36 of relatively low heat production. ("High" heat production and "low" heat production are referenced in relation to each other, and do not imply any particular numerical values. "High" is greater than "low".) The first region 34 typically underlies the heat-producing device 22. (Not every microelectronic structure used in MMICs produces significant amounts of heat, and therefore not every microelectronic structure is associated with a first region 34.) In FIG. 1, there are two first regions 34, one underlying each of the heat-producing devices 22, and several second regions 36. The present invention is in part concerned with removing heat from the first region 34 as rapidly as possible.

FIG. 2 depicts a microwave monolithic integrated circuit (MMIC) assembly 40, wherein the MMIC 20 is assembled with and in thermal contact with a generally planar heat-dissipating assembly 42. As illustrated, the heat-dissipating assembly 42 is in direct physical contact with the MMIC 20 to achieve thermal communication. Equivalently for the present purposes, the heat-dissipating assembly 42 may be in thermal communication with the MMIC 20 by other means, such as an intermediate solid thermal conductor, a heat pipe, or the like. The heat-dissipating assembly has a core 44 comprising at least two pieces of pyrolytic graphite 46 and 48 embedded within, and bonded to, an interior wall 50 of a casing 52. The casing 52 typically includes a first preform 70 contacting a top 72 of the core 44, a second preform 74 contacting a bottom 76 of the core 44, and a lateral 78 wall enclosing a lateral periphery 80 of the core 44. The elements 70, 74, and 78 are bonded to each other at their joints and to the core 44 along the interior wall 50. The portions of the first preform 70 and the second preform 74 that underlie the heat-producing devices 22 are preferably made as thin as possible consistent with structural integrity, so as to provide as little thermal-impedance as possible. The casing 52 may comprise flat solid pieces of material, or shaped and structured pieces of material as shown in U.S. Pat. No. 6,075,701, whose disclosure is incorporated by reference.

The casing 52 may be hermetic or non-hermetic, but is preferably hermetic to provide complete mechanical and environmental protection to the core 44. The casing is preferably a metal with a high thermal conductivity, such as aluminum, silver, or copper, or alloys thereof. It is strongly preferred that the heat-dissipating assembly 42 have no structural layers comprising organic materials therein. Such organic materials within the heat-dissipating assembly 42, if present, would be prone to producing organic vapors during fabrication or service, which could adversely affect the fabrication and/or the functionality of the heat-dissipating assembly 42. There may be some minor amount of organic contaminant within the heat-dissipating assembly 42, but no organic layers or other organic structures are intentionally present.

The pieces of pyrolytic graphite 46 and 48 comprise a first piece 46 of pyrolytic graphite underlying the first region 34 of relatively high heat production, and a second piece 48 of pyrolytic graphite underlying the second region 36 of relatively low heat production. (As used herein, "underlying" means aligned under or below, in a vertical direction parallel to the direction 31, and also parallel to the direction 66 discussed subsequently.) Pyrolytic graphite is a form of graphite typically prepared by chemical vapor deposition and post processing of carbon. As shown in FIG. 3, the resulting pyrolytic graphite article 54 is generally planar with two orthogonal directions $x_1$ and $x_2$ lying in a plane of high thermal conductivity. Because these two directions $x_1$ and $x_2$ are substantially identical in respect to thermal conductivity and thermal expansion, they are referred to herein as the high-thermal-conductivity x-direction of the pyrolytic graphite. That is, the x-direction of the pyrolytic graphite is any direction lying in the plane defined by the $x_1$ and $x_2$ high-thermal-conductivity directions illustrated in FIG. 3. A z-direction is perpendicular to the plane defined by the $x_1$ and $x_2$ directions.

The pyrolytic graphite has a thermal conductivity of greater than about 1550 watts per meter-K, and typically about 1700–1750 watts per meter-K, in the high-thermal-conductivity x-direction lying in the plane of high thermal conductivity. Suitable pieces of pyrolytic graphite for use in the present invention are available commercially from suppliers such as B. F. Goodrich, Inc. The pyrolytic graphite has a much lower thermal conductivity, on the order of about 10–15 watts per meter-K, in the z-direction. ("High" thermal conductivity and "low" thermal conductivity are referenced in relation to each other, and do not imply any particular numerical values. "High" is greater than "low".)

In the heat-dissipating assembly 42, the orientations of the pieces 46 and 48 of pyrolytic graphite 54 are described relative to a heat-dissipating-assembly plane 64 and its perpendicular direction 66. The heat-dissipating assembly plane 64 is the plane of the generally planar heat-dissipating assembly 42. When the MMIC 20 and the heat-dissipating assembly 42 are assembled together to form the MMIC assembly, the planes 30 and 64 are substantially parallel, and the directions 31 and 66 are substantially parallel.

Figure 4:
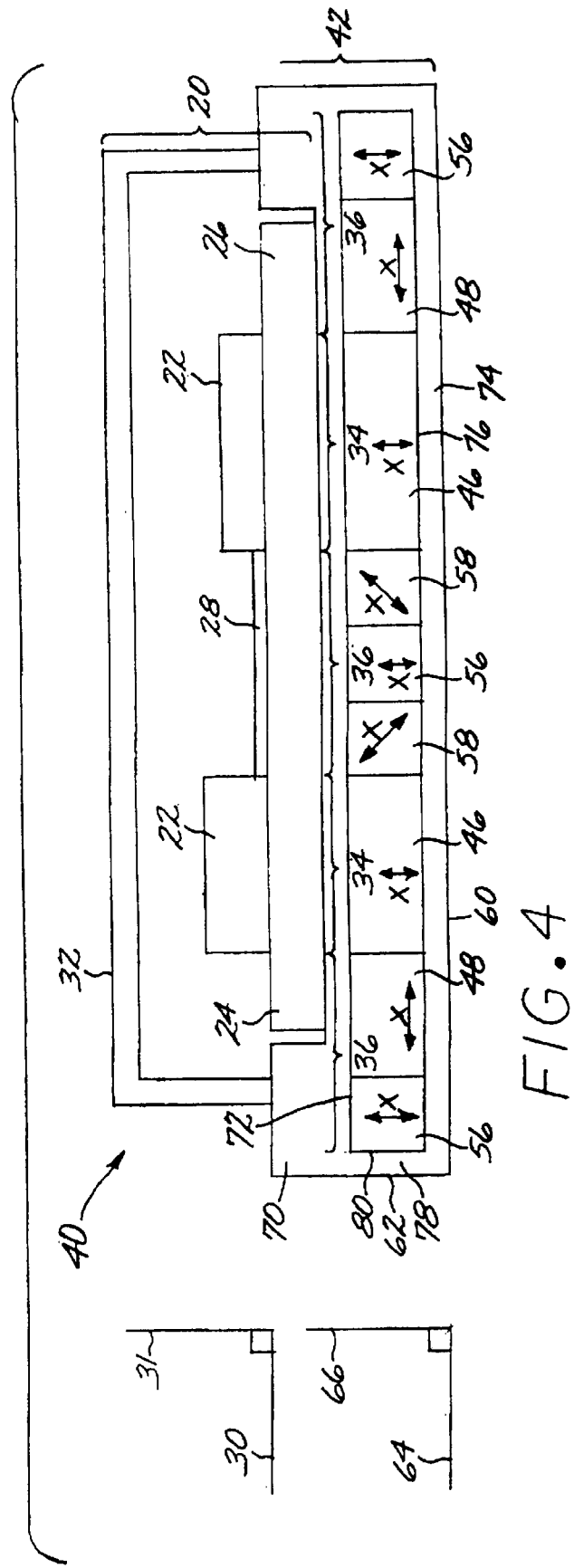
FIG. 4 is a schematic side sectional view of a second embodiment of a microwave monolithic integrated circuit assembly incorporating the microwave monolithic integrated circuit of FIG. 1 and a multi-orientation heat-dissipating assembly.

The first piece 46 of pyrolytic graphite 54 is oriented so that the high-thermal-conductivity x-direction of the first piece 46 lies within about 20 degrees of the perpendicular 66 to the heat-dissipating assembly plane 64 (and thence within about 20 degrees of the perpendicular 31 to the MMIC circuit plane 30 in the MMIC assembly 40). If the high-thermal-conductivity x-direction lies more than about 20 degrees from the perpendicular 66 to the heat-dissipating assembly plane 64 (and thence the perpendicular 31 to the MMIC circuit plane 30), its effectiveness in distributing heat downwardly from the first region 34 of high heat production is compromised. Preferably, the high-thermal conductivity x-direction of the first piece 46 lies substantially perpendicular to the heat-dissipating-assembly plane 64 (and thence the MMIC circuit plane 30), or, alternatively stated, parallel to the perpendicular directions 66 and 31). In FIGS. 2 and 4, the orientation of the high-thermal-conductivity x-direction is indicated schematically in the first piece 46 by double-ended arrows oriented generally parallel to the perpendicular directions 66 and 31.

The second piece 48 of pyrolytic graphite 54 is oriented so that the high-thermal-conductivity x-direction of the second piece 48 lies within about 20 degrees of the heat-dissipating-assembly plane 66 (and thence the MMIC circuit plane 30 in the MMIC assembly 40). If the high-thermal-conductivity x-direction lies more than about 20 degrees from the heat-dissipating-assembly plane 66 (and thence the MMIC circuit plane 30), its effectiveness in conducting heat laterally from the first region 34 of high heat production is compromised. Preferably, the high-thermal conductivity x-direction of the second piece 48 lies substantially parallel to the heat-dissipating-assembly plane 66 (and thence the MMIC circuit plane 30). In FIGS. 2 and 4, the orientation of the high-thermal-conductivity x-direction is indicated schematically in the second piece 48 by double-ended arrows oriented generally parallel to the planes 64 and 30.

Additionally, and as illustrated in FIG. 4, the heat-dissipating assembly 42 may further include a third piece 56 of pyrolytic graphite 54 that does not underlie the first region 34 of relatively high heat production but has the high-thermal-conductivity x-direction of the third piece 56 within about 20 degrees of the perpendicular to (and preferably substantially perpendicular to) the MMIC plane 30. In FIG. 4, the orientation of the high-thermal-conductivity x-direction is indicated schematically in the third piece 56 by double-ended arrows oriented generally parallel to the perpendicular directions 66 and 31.

Additionally, and as also illustrated in FIG. 4, the heat-dissipating assembly 42 may further include a fourth piece 58 of pyrolytic graphite 54 that does not underlie the first region 34 of relatively high heat production but has the high-thermal-conductivity x-direction of the third piece 56 at some arbitrarily selected angle relative to the MMIC plane 30. In FIG. 2, the orientation of the high-thermal-conductivity x-direction is indicated schematically in the fourth piece 58 by double-ended arrows oriented at an arbitrarily selected angle relative to the perpendicular directions 66 and 31.

The locations and widths of the second piece 48, the third piece 56 (where present), and the fourth piece 58 (where present) may be selected to maximize the heat flow from the heat-producing first region (or regions) 34 to a bottom 60 or to a side 62 of the casing 52. From the bottom 60 and the side 62 of the casing 52, the heat is conducted to an external radiator or other larger heat sink by any appropriate thermally conductive structure. The locations and widths of the second piece 48, the third piece 56 (where present), and the fourth piece 58 (where present) are typically selected according to a thermal analysis, such as a finite element thermal analysis, specific to a particular MMIC 20 and the characteristics of its heat-producing microwave devices 22, taking into account its dimensions, materials of construction, types and locations of the heat-producing microwave devices, and other structural features. The present approach is not concerned with this process and any specific arrangement of the pieces 48, 56, and 58, but instead provides the structural approach by which the thermally optimized dissipation design may be implemented.

FIG. 5 illustrates a preferred approach to fabricating the MMIC assembly 40. The MMIC 20 is fabricated by conventional techniques specific to the selected MMIC 20 and furnished, numeral 90. Separately and independently, the heat-dissipating assembly is fabricated, numeral 92. To perform this fabrication 92, the pieces 46, 48, 56 (if used), and 58 (if used) are prepared, numeral 94, typically by cutting properly shaped and oriented pieces from a plate of pyrolytic graphite 54. The selection of the locations, sizes, and orientations of the pieces 46, 48, 56, and 58 is made responsive to the nature of the MMIC 20, typically using a computer-based heat flow analysis such as a finite element analysis. The disassembled casing elements, typically including the elements 70, 74, and 78, are also furnished, numeral 94. The lateral wall 78 may be formed of a piece of the same material as the preforms 70 and 74, or it may be formed by mechanically deforming inwardly the sides of the preforms 70 and 74 until they contact each other in the desired geometry. Other materials may also be embedded within the assembled configuration to form passive microwave distribution devices.

These elements of the heat-dissipating assembly 42, furnished in step 94, are assembled as an initial assembly, numeral 96. That is, the pyrolytic graphite pieces 46, 48, 56 (where used), and 58 (where used) and the disassembled elements of the casing 52 (such as the preforms 70 and 74 and the lateral wall 78 (where used) are assembled into the desired arrangement and held in place, usually with the help of appropriate tooling.

This initial assembly is hot pressed to form the heat-dissipating assembly, numeral 98. In the preferred approach, the initial assembly is placed into a container such as a steel can that is initially closed on one end. The initial assembly is placed into the can through the open end. The interior of the can is evacuated, such as by placing the entire can into a vacuum chamber and evacuating the vacuum chamber. Preferably, the interior of the can is heated during the evacuation to a temperature of about 500° F. to about 600° F. to degas the interior of the can and the initial assembly. While the interior of the can is evacuated, an end closure is welded in place, such as by using a commercial TIG welder. The evacuation of the interior of the can removes gaseous contaminants that otherwise might interfere with the intimate surface contact of the interior wall 50 of the casing 52, and the pyrolytic graphite pieces 46, 48, 56, and 58 during subsequent processing.

The evacuated and sealed can, with the initial assembly therein, is placed into a hot isostatic pressing (HIP) apparatus and hot isostatically pressed, thereby hot isostatically pressing the initial assembly inside the can. In hot isostatic pressing, the article being hot isostatically pressed, here the can and the initial assembly inside the can, are heated to elevated temperature under an applied external pressure (while the interior of the can remains evacuated). In a preferred approach where the casing 52 is 6061 aluminum, the hot isostatic pressing is performed at a temperature of about 950° F. to about 1050° F., and an applied external pressure of from about 15,000 to about 60,000 pounds per square inch, in a cycle requiring 2 hours.

Heating to and cooling from the hot isostatic pressing temperature are performed in a quasi-equilibrium manner, so that the heat-dissipating assembly remains at approximately the same temperature throughout. The larger the initial assembly, the slower the heating rate. In a typical case, however, the heating rate to, and the cooling rate from, the hot isostatic pressing temperature is from about 5 to about 6° F. per minute.

The quasi-equilibrium cooling is important in achieving a final structure where there is little or no residual thermal stresses between the casing 52 and the pyrolytic graphite piece 46, 48, 56, and 58. Such residual thermal stresses arise because of the different thermal expansion coefficients of the casing and the pyrolytic graphite pieces. The residual stresses would be high if they were allowed to be created and remain during the cooling of the structure from the hot isostatic pressing temperature. In the present approach, the can and the hot isostatically pressed assembly therein are cooled sufficiently slowly that the residual stresses which would otherwise be present are relaxed by plastic deformation of the metal during cooling.

The attention paid to minimizing residual thermal stresses within the heat-dissipating assembly 42 allows the heat-dissipating assembly 42 to be made by hot isostatic pressing, hot pressing, or other elevated temperature technique. The pressing technique produces an intimate physical contact between, and bonding between, the elements 70, 74, and 76 of the casing 54, and between these elements of the casing 54 and the pyrolytic graphite pieces 46, 48, 56, and 58. The "intimate contact" is a close facing contact between the two materials, without intervening gap, structure, or material, producing a good bond therebetween. The intimate contact improves the thermal transfer between the casing and the pyrolytic graphite piece, improving the thermal performance of the heat-dissipating assembly. By contrast, in some prior approaches, such as that described in U.S. Pat. No. 5,296,310, the central heat conducting element was placed into a frame and allowed to slide relative to the frame to avoid buildup of shear stresses. While this technique does alleviate residual stresses, it also greatly reduces the thermal transfer rate at the interface between the casing and the pyrolytic graphite piece, an undesirable result. The present approach achieves acceptably low residual thermal stresses while also attaining an intimate bond between the casing and the pyrolytic graphite piece and thence improved thermal transfer properties. There is a consideration of possible thermal stresses generated during service, but the present inventors have determined that these thermal stresses are not sufficiently large, over the temperature range experienced during service applications, to be of great concern. The present fabrication approach and the resulting MMIC assembly 40 are therefore fully satisfactory.

The hot pressing 98 may followed by an optional heat treating. If the material chosen for the casing 52 requires heat treatment to achieve its desired properties—such as a quenching and aging treatment—that heat treatment is performed. The heat treatment may also include a final normalizing (i.e., slow cooling) treatment to aid in minimizing residual thermal stresses.

The heat-dissipating assembly 42 is optionally final machined, and optionally final processed, as may be required for a particular MMIC assembly 40. In final machining, features such as the mounting holes and any cavities are machined into the casing 52. In final processing, the heat-dissipating assembly is coated, plated (as with gold), cleaned, deburred, or otherwise final processed.

The MMIC circuit, prepared separately in step 90, is thereafter assembled with and affixed to the heat-dissipating assembly 42 by any operable technique, numeral 100. The affixing may be accomplished, for example, using a curable adhesive, brazing, or the like.

MMIC assemblies 40 have been prepared by the approach discussed above and have been found highly satisfactory.

Although a particular embodiment of the invention has been described in detail for purposes of illustration, various modifications and enhancements may be made without departing from the spirit and scope of the invention. Accordingly, the invention is not to be limited except as by the appended claims.

What is claimed is:

1. A microwave monolithic integrated circuit assembly, comprising:
   a microwave monolithic integrated circuit lying in an MMIC circuit plane and having a first region of relatively high heat production and a second region of relatively low heat production; and
   a heat-dissipating assembly in thermal contact with the microwave monolithic integrated circuit, the heat-dissipating assembly comprising a casing and a core, the core comprising at least two pieces of pyrolytic graphite embedded within the casing and bonded to an interior wall of the casing, the at least two pieces of pyrolytic graphite comprising
      a first piece of pyrolytic graphite underlying the first region of relatively high heat production and having a high-thermal-conductivity x-direction of the first piece lying within about 20 degrees of a perpendicular to the MMIC circuit plane, and
      a second piece of pyrolytic graphite underlying the second region of relatively low heat production and having a high-thermal-conductivity x-direction of the second piece lying within about 20 degrees of the MMIC circuit plane.

2. The microwave monolithic integrated circuit assembly of claim 1, wherein the casing is a metal.

3. The microwave monolithic integrated circuit assembly of claim 1, wherein the casing comprises a metal selected from the group consisting of aluminum, copper, and silver, and alloys thereof.

4. The microwave monolithic integrated circuit assembly of claim 1, wherein the casing is hermetic.

5. The microwave monolithic integrated circuit assembly of claim 1, wherein the heat-dissipating assembly has no structural layers comprising organic materials therein.

6. The microwave monolithic integrated circuit assembly of claim 1, wherein
   the microwave monolithic integrated circuit includes multiple first regions and multiple second regions, and
   the heat-dissipating assembly includes
      multiple first pieces of pyrolytic graphite underlying the respective multiple first regions, and
      multiple second pieces of pyrolytic graphite underlying the respective multiple second regions.

7. The microwave monolithic integrated circuit assembly of claim 1, wherein the heat-dissipating assembly further includes
   a third piece of pyrolytic graphite that does not underlie the first region of relatively high heat production and has the high-thermal-conductivity x-direction of the third piece within about 20 degrees of the perpendicular to the MMIC plane.

8. The microwave monolithic integrated circuit assembly of claim 1, wherein the casing comprises
   a first preform contacting a top of the core,
   a second preform contacting a bottom of the core, and
   a lateral wall enclosing a lateral periphery of the core.

9. A microwave monolithic integrated circuit assembly, comprising:
   a microwave monolithic integrated circuit lying in an MMIC circuit plane and having a first region of relatively high heat production and a second region of relatively low heat production; and
   a heat-dissipating assembly in thermal contact with the microwave monolithic integrated circuit, the heat-dissipating assembly having a core comprising at least two pieces of pyrolytic graphite embedded within a casing and bonded to an interior wall of the casing, the at least two pieces of pyrolytic graphite comprising
      a first piece of pyrolytic graphite underlying the first region of relatively high heat production and having a high-thermal-conductivity x-direction of the first piece lying substantially perpendicular to the MMIC circuit plane,
      a second piece of pyrolytic graphite underlying the second region of relatively low heat production and having a high-thermal-conductivity x-direction of the second piece lying substantially parallel to the MMIC circuit plane.

10. The microwave monolithic integrated circuit assembly of claim 9, wherein the casing comprises
    a first preform contacting a top of the core,
    a second preform contacting a bottom of the core, and
    a lateral wall enclosing a lateral periphery of the core.

11. The microwave monolithic integrated circuit assembly of claim 9, wherein the casing is a metal.

12. The microwave monolithic integrated circuit assembly of claim 9, wherein the casing comprises a metal selected from the group consisting of aluminum, copper, and silver, and alloys thereof.

13. The microwave monolithic integrated circuit assembly of claim 9, wherein the casing is hermetic.

14. The microwave monolithic integrated circuit assembly of claim 9, wherein the heat-dissipating assembly has no structural layers comprising organic materials therein.

15. The microwave monolithic integrated circuit assembly of claim 9, wherein
    the microwave monolithic integrated circuit includes multiple first regions and multiple second regions, and
    the heat-dissipating assembly includes
       multiple first pieces of pyrolytic graphite underlying the respective multiple first regions, and
       multiple second pieces of pyrolytic graphite underlying the respective multiple second regions.

16. The microwave monolithic integrated circuit assembly of claim 9, wherein the heat-dissipating assembly further includes
    a third piece of pyrolytic graphite that does not underlie the first region of relatively high heat production and has the high-thermal-conductivity x-direction of the third piece substantially perpendicular to the MMIC plane.

17. A method for fabricating a microwave monolithic integrated circuit assembly, comprising the steps of:
    furnishing a microwave monolithic integrated circuit lying in an MMIC circuit plane and having a first region of relatively high heat production and a second region of relatively low heat production;
    fabricating a heat-dissipating assembly which has a relatively large dimension lying in a heat-dissipating-assembly plane and a relatively small dimension lying perpendicular to the heat-dissipating-assembly plane, the heat-dissipating assembly having a core comprising at least two pieces of pyrolytic graphite embedded within a casing and bonded to an interior wall of the casing, the at least two pieces of pyrolytic graphite comprising
       a first piece of pyrolytic graphite having a high-thermal-conductivity x-direction of the first piece lying substantially perpendicular to the heat-dissipating-assembly plane, and a second piece of pyrolytic graphite, having a high-thermal-conductivity x-direction of the second piece lying substantially parallel to the heat-dissipating-assembly plane; and assembling the microwave monolithic integrated circuit to the heat-dissipating assembly with the MMIC circuit plane parallel to the heat-dissipating-assembly plane and with the first piece of pyrolytic graphite underlying the first region of relatively high heat production and the second piece of pyrolytic graphite underlying the second region of relatively low heat production.

18. The method of claim 17, wherein the casing comprises a first preform contacting a top of the core, a second preform contacting a bottom of the core, and a lateral wall enclosing a lateral periphery of the core.

19. The method of claim 17, wherein the step of fabricating the heat-dissipating assembly includes the steps of furnishing the at least two pieces of pyrolytic graphite and a set of disassembled elements of a casing;

assembling the at least two pieces of pyrolytic graphite within the interior of the disassembled elements of the casing positioned so as to form an initial assembly;

placing the initial assembly into an evacuated interior of an elevated-temperature pressing apparatus; and heating and simultaneously applying pressure to the initial assembly using the elevated temperature pressing apparatus until a resulting heat-dissipating assembly is substantially fully dense.

20. The method of claim 17, wherein the step of fabricating the heat-dissipating assembly includes the step of hot isostatic pressing.

* * * * *